United States Patent [19]

Sasagawa et al.

[11] Patent Number: 5,200,878
[45] Date of Patent: Apr. 6, 1993

[54] DRIVE CIRCUIT FOR CURRENT SENSE IGBT

[75] Inventors: Kiyoaki Sasagawa; Hiroshi Miki, both of Kanagawa, Japan

[73] Assignee: Fuji Electric Co., Ltd., Kawasaki, Japan

[21] Appl. No.: 729,436

[22] Filed: Jul. 12, 1991

[30] Foreign Application Priority Data

Jul. 19, 1990 [JP] Japan ................................ 2-191057

[51] Int. Cl.$^5$ .............................................. H03K 17/08
[52] U.S. Cl. ........................................ 361/93; 361/93; 361/98; 361/18
[58] Field of Search ................ 361/18, 93, 98, 100, 361/56, 91, 88

[56] References Cited

U.S. PATENT DOCUMENTS 4,721,869  1/1988  Okado ................................ 361/88
4,949,213  8/1990  Sasagawa et al. ................ 361/91

FOREIGN PATENT DOCUMENTS 0369448  5/1990  European Pat. Off. .
2635929  3/1990  France .

*Primary Examiner*—A. D. Pellinen
*Assistant Examiner*—S. Jackson
*Attorney, Agent, or Firm*—Spencer, Frank & Schneider

[57] ABSTRACT

A drive circuit for a current sense IGBT having, in addition to a fault discrimination operational circuit for detecting an overcurrent of the current sense IGBT, a capacitor operatively connected in parallel to the gate-emitter of the current sense IGBT, and a transistor for discharging the capacitor via a resistor. In case of short-circuit fault, an overcurrent is detected by the fault discrimination operational circuit, and the transistor is turned on via the operational circuit. The gate voltage of the IGBT is gradually declined to turn off the IGBT. This enables the IGBT to be protected from a transitional overvoltage across the collector and emitter of the IGBT.

21 Claims, 8 Drawing Sheets

DRIVE CIRCUIT FOR CURRENT SENSE IGBT

BACKGROUND OF THE INVENTION

1. Field of the Invention

The present invention relates to a drive circuit for a current sense IGBT (Insulated Gate Bipolar Transistor) that can detect the current through the IGBT itself, and particularly to a drive circuit that can be applied to power conversion apparatuses such as inverters to protect the IGBT from an overcurrent caused by faults like accidental shorts.

2. Description of the Prior Art

An IGBT is a new device having the advantages of both a bipolar transistor and a power MOSFET. High withstanding voltages and large current capacities can be easily achieved as in a bipolar transistor, and high switching speed and easy driving can be attained, as in a MOSFET FIG. 1 is a circuit diagram showing the equivalent circuit of an N-channel IGBT. Incidentally, throughout the following drawings, like reference numerals designate like or corresponding parts.

In FIG. 1, the IGBT is composed of an N-channel MOSFET 1, an NPN transistor 2, a PNP transistor 3, and a resistor 4 connecting the base and emitter of the transistor 2. The drain-source of the MOSFET 1 and the emitter-collector of the transistor 2 are connected in parallel, and the transistors 2 and 3 can be represented as constituting a thyristor circuit.

Recently, IGBT devices incorporating a current detecting function have been developed to further improve the performance thereof. A current sense IGBT includes a current detecting chip incorporated in the IGBT chip. The current flowing through the current detecting chip is detected and a detection signal is generated.

FIGS. 2A and 2B are diagrams showing the symbol and the equivalent circuit of a current sense IGBT, respectively. As shown in FIG. 2B, the current sense IGBT Q1 is composed of a main IGBT Qm and a current detecting IGBT Qs which are connected in parallel. The current Ic of the current sense IGBT Q1 is divided between the main IGBT Qm and the current detecting IGBT Qs. The current flowing through the current detecting IGBT Qs is determined by the ratio of the chip area the current detecting IGBT Qs to the entire chip area of the IGBT Q1. Accordingly, the current flowing through the main IGBT Qm can be calculated from the ratio.

When an IGBT is used in a power conversion apparatus such as an inverter, it is important to protect the IGBT from damage even if an overcurrent fault takes place during the operation of the inverter. A short-circuit fault is a well known overcurrent fault that may cause device damage.

FIG. 3 is a circuit diagram simulating a short-circuit fault, and FIGS. 4A and 4B are diagrams showing the voltage $V_{CE}$ and the current $I_c$ of the IGBT Q during the short-circuit fault, respectively. As shown in FIGS. 4A and 4B, a direct current power supply voltage Ed is applied to the IGBT Q during the short-circuit, and the current $I_c$ flowing through the IGBT Q increases to more than five to six times the rated direct current $I_{CR}$ of the IGBT Q. Accordingly, a large amount of power is applied to the IGBT Q during the short-circuit period. Consequently, to protect the IGBT Q during the short circuit, it is necessary to turn off the IGBT Q in a time period (about 10 $\mu$m) the device can endure. Thus, using the current sense function for overcurrent protection is an effective method for protecting the IGBT Q.

FIG. 5 is a circuit diagram showing a conventional gate drive circuit for a current sense IGBT with an overcurrent protection function. In this figure, reference character Q1 designates a current sense IGBT as a main switching device, PH1 denotes a photocoupler for signal isolation, V1 denotes a voltage source for supplying an on-gate voltage, and V2 designates a voltage source for supplying an off-gate voltage.

The normal operation of the gate drive circuit of FIG. 5 will now be described. When the photocoupler PH1 is turned on, a transistor T1 turns off, thereby turning a transistor T2 on and transistor T3 off. Thus, the on-gate voltage V1 is applied across the gate and emitter of the IGBT Q1 through a gate resistor $R_G$. On the other hand, when the photocoupler PH1 is turned off, the transistor T1 turns on, thereby turning the transistor T2 off and the transistor T3 on. Thus, the off-gate voltage V2 is applied across the gate and emitter of the IGBT Q1 through the gate resistor $R_G$.

The overcurrent protection operation of the gate drive circuit of FIG. 5 will now be described. While the IGBT Q1 is on, a detection current $I_{CM}$ of the IGBT Q1 is applied to a fault discrimination operational circuit 100. The operational circuit 100 compares a reference value $I_{OC}^*$ with the detection current $I_{CM}$, and judges that an overcurrent fault is taking place when the detection current $I_{CM}$ is greater than the reference value $I_{OC}^*$. The operational portion 100 produces a signal for turning on a transistor T4. When the transistor T4 turns on, the off-gate voltage V2 is applied across the gate and emitter of the IGBT Q1, thereby interrupting the overcurrent.

The conventional gate drive circuit of FIG. 5, however, has a problem in that an overvoltage produced due to the overcurrent may damage the IGBT Q1. More specifically, when the transistor T4 is turned on, the off-gate voltage V2 is simultaneously applied to the gate of the IGBT Q1, and hence a large current reduction ratio $-di/dt$ occurs in the IGBT Q1 during the overcurrent limitation. Thus, the sum of the voltage $ldi/dt$ induced due to wire inductance and the DC voltage of the direct circuit is applied to the IGBT Q1, which may cause damage to the device Q1.

SUMMARY OF THE INVENTION

It is therefore an object of the present invention to provide a drive circuit for a current sense IGBT that can eliminate the problem so as to protect the IGBT from an overcurrent.

In a first aspect of the present invention, there is provided a drive circuit for a current sense IGBT which has a main circuit through which a main current flows, a gate for controlling the main current flowing the main circuit, and a sense circuit which detects the main current and outputs a signal corresponding to the main current as a detected current, the drive circuit comprising:

means for discriminating an overcurrent of the main current on the basis of the detected current; and a variable voltage source, connected between the means for discriminating and the gate of the IGBT, for gradually reducing a voltage applied to the gate of the IGBT while the means for discriminating detects the overcurrent.

Here, the variable voltage source may comprise a capacitor whose terminal is operatively connected to the gate of the current sense IGBT, and a discharge circuit, connected to the capacitor, for discharging the capacitor in response to an output of the means for discriminating.

The discharge circuit may comprise a serial circuit of a resistor and a transistor, which serial circuit is connected to the capacitor in parallel fashion, a base of the transistor being connected to the output of the means for discriminating.

The means for discriminating may comprise a comparator which compares a detected current outputted from the sense circuit of the IGBT with a predetermined reference signal.

The drive circuit for a current sense IGBT may further comprise an on-gate voltage source for producing an on-gate voltage to be supplied to the gate of the IGBT, an off-gate voltage source for producing an off-gate voltage to be supplied to the gate of the IGBT, and a switching circuit for applying to the gate the on-gate voltage when turning on the IGBT and the off-gate voltage when turning off the IGBT.

An output of the variable voltage source may be applied to an input of the switching circuit so that the output of the variable voltage source gradually reduces the on-gate voltage applied to the gate of the IGBT.

In a second aspect of the present invention, there is provided a drive circuit for a current sense IGBT which has a main circuit through which a main current flows, a gate for controlling the main current flowing the main circuit, and a sense circuit which detects the main current and outputs a signal corresponding to the main current as a detected current, the drive circuit comprising:

means for discriminating an overcurrent of the main current on the basis of the detected current;

a variable voltage source, connected between the means for discriminating and the gate of the IGBT, for gradually reducing a voltage applied to the gate of the IGBT while the means for discriminating detects the overcurrent; and a transistor whose base terminal is connected to an output of the variable voltage source, and which short circuits the gate and emitter of the IGBT in response to the decline of the output of the variable voltage source.

In a third aspect of the present invention, there is provided a drive circuit for a current sense IGBT which has a main circuit through which a main current flows, a gate for controlling the main current flowing the main circuit, and a sense circuit which detects the main current and outputs a signal corresponding to the main current as a detected current, the drive circuit comprising:

means for discriminating an overcurrent of the main current on the basis of the detected current;

a variable voltage source, connected between the means for discriminating and the gate of the IGBT, for gradually reducing voltage applied to the gate of the IGBT while the means for discriminating detects the overcurrent; and a diode connected between the gate of the IGBT and an output of the variable voltage source for guiding a current $i = C_{CG}\cdot dV_{CE}/dt$ of the IGBT to the variable voltage source, where $C_{CG}$ is the junction capacitance between the collector and gate of the IGBT, and $V_{CE}$ is the collector-to-emitter voltage of the IGBT.

When the transistor, which is driven by the fault discriminating operational circuit, is turned on, the voltage across the gate and emitter of the IGBT Q1 is reduced by using the capacitor, which gradually discharges via the discharging circuit. More specifically, peak the values $I_{CP}$ of a short-circuit current flowing through the current sense IGBT Q1 exhibit the characteristics shown in FIG. 6 depending on the voltage $V_{GE}$ across the gate and emitter of the IGBT. Accordingly, the voltage $V_{GE}$ across the gate and emitter of the current sense IGBT Q1 can be gradually reduced with time if the short circuit current $I_C$ is gradually reduced by using the characteristics after an overcurrent is detected. A broken line of FIG. 4B indicates the waveform of the short circuit current $I_C$ of the present invention in contrast with the solid curve, indicating the conventional short circuit current $I_C$. As will be clearly seen from this figure, the current reduction ratio $-di/dt$ during the interruption of the overcurrent can be restricted. Consequently, the voltage $l(di/dt)$ induced due to the wire inductance l becomes small, thereby preventing the IGBT Q1 from being subjected to an overvoltage.

The above and other objects, effects, features and advantages of the present invention will become more apparent from the following description of the embodiments thereof taken in conjunction with the accompanying drawings.

DETAILED DESCRIPTION OF PREFERRED EMBODIMENT

The invention will now be described with reference to the accompanying drawings.

FIRST EMBODIMENT

Figure 1:
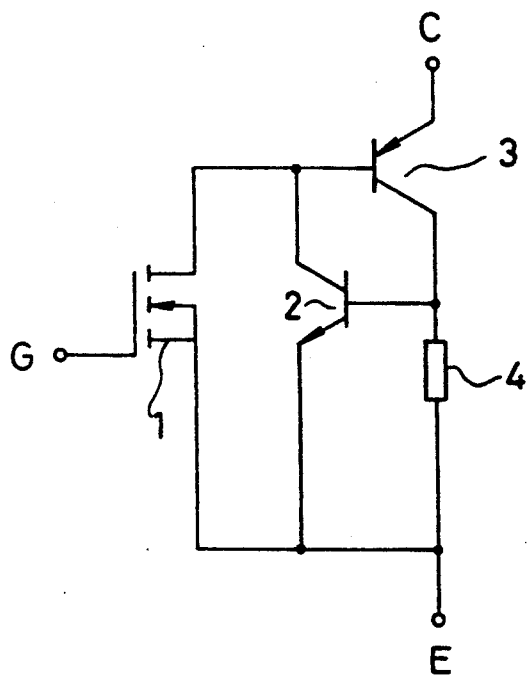
FIG. 1 is a circuit diagram showing the equivalent circuit of an N-channel IGBT.
Figure 6:
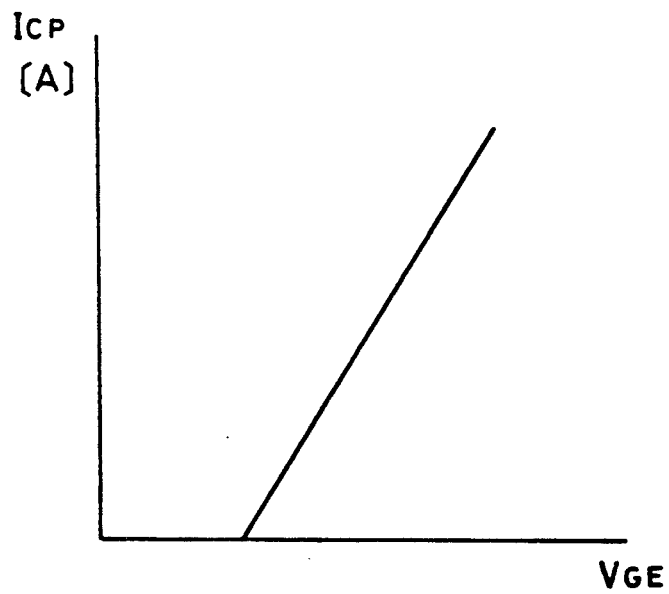
FIG. 6 is a graph illustrating the relationship between the peak values $I_{CP}$ of a short-circuit current flowing through the current sense IGBT Q1 and the voltage $V_{GE}$ across the gate and emitter of the IGBT.
Figure 2A:
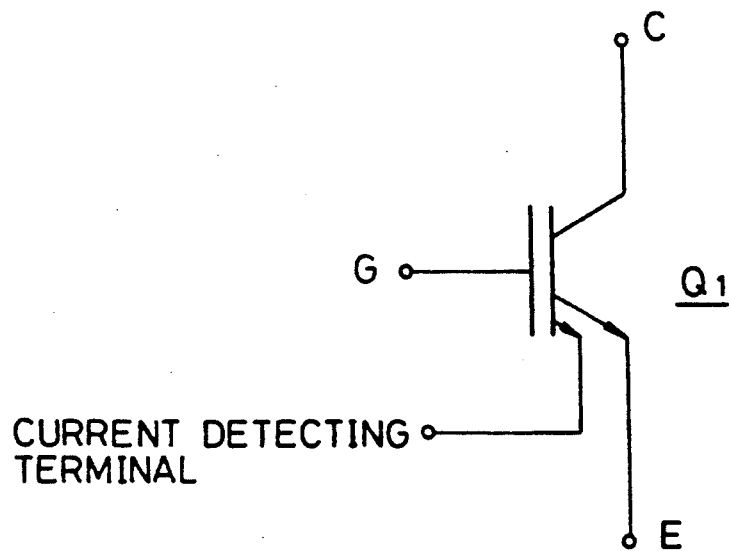
FIGS. 2A and 2B are diagrams showing the symbol and the equivalent circuit of a current sense IGBT, respectively.
Figure 2B:
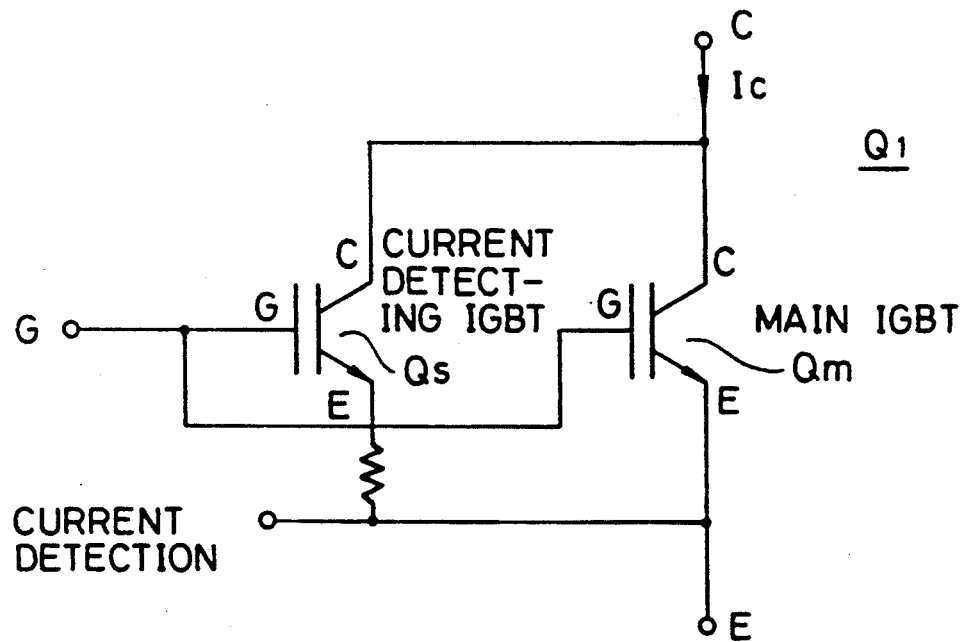
Figure 3:
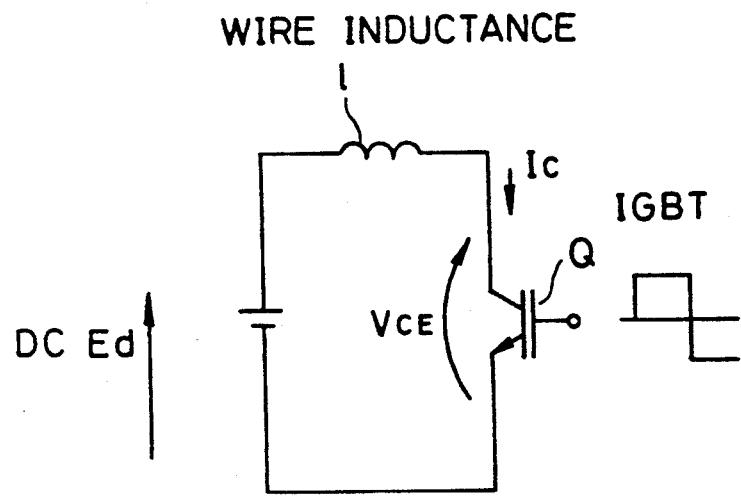
FIG. 3 is a circuit diagram showing a circuit for simulating a short-circuit fault.
Figure 4A:
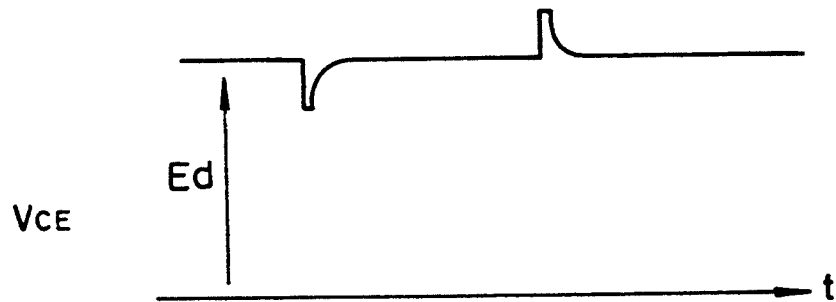
FIGS. 4A and 4B are diagrams showing the voltage $V_{CE}$ and the current $I_C$ of the IGBT Q during the short-circuit fault, respectively.
Figure 4B:
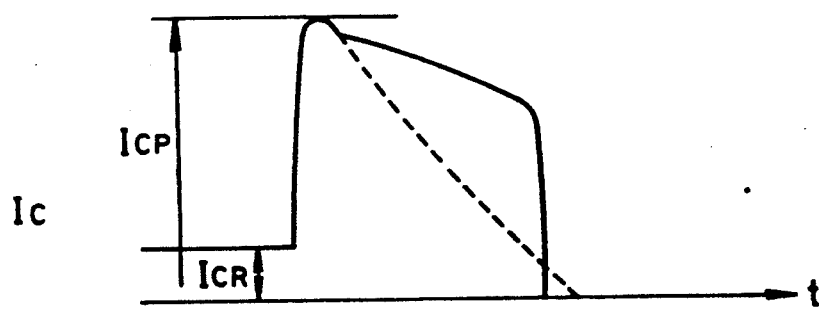
Figure 5:
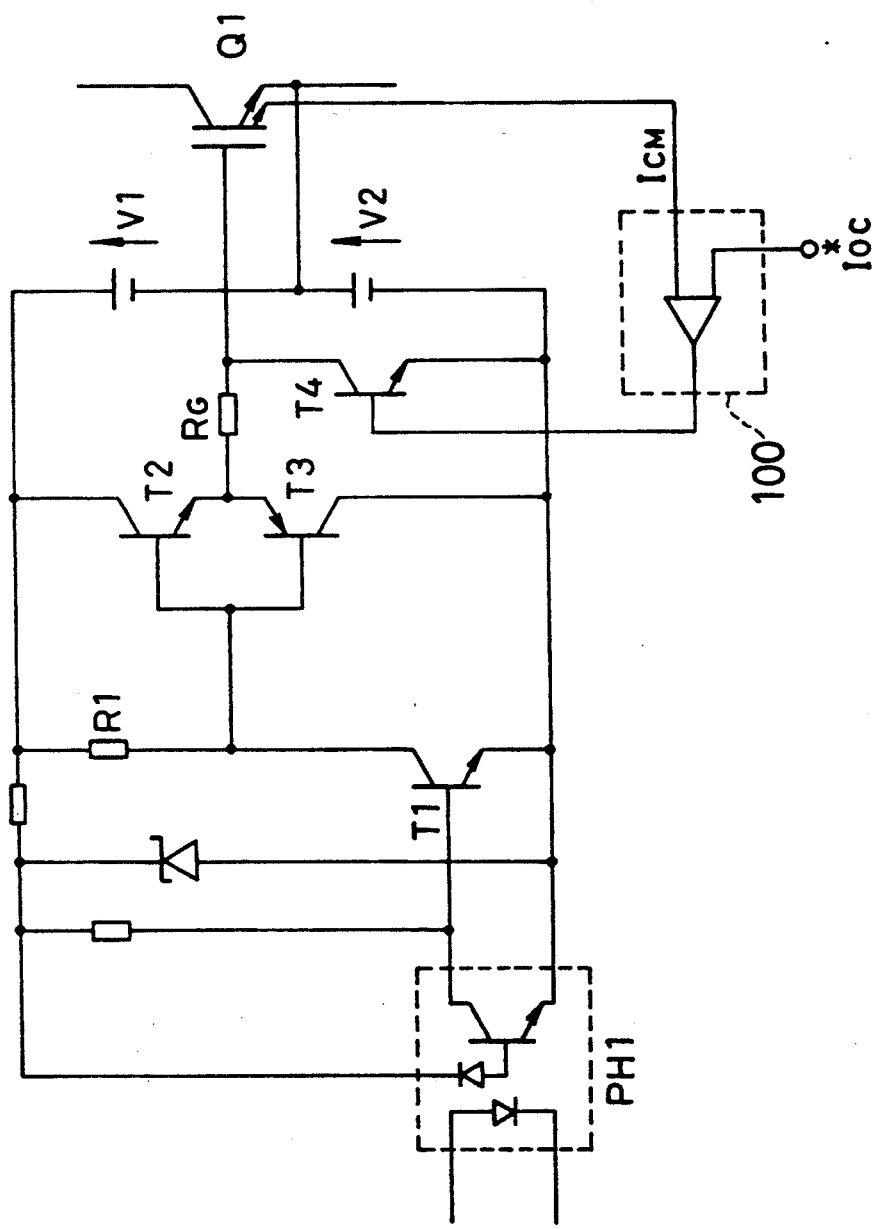
FIG. 5 is a circuit diagram showing a conventional gate drive circuit for a current sense IGBT with an overcurrent protection function.
Figure 7:
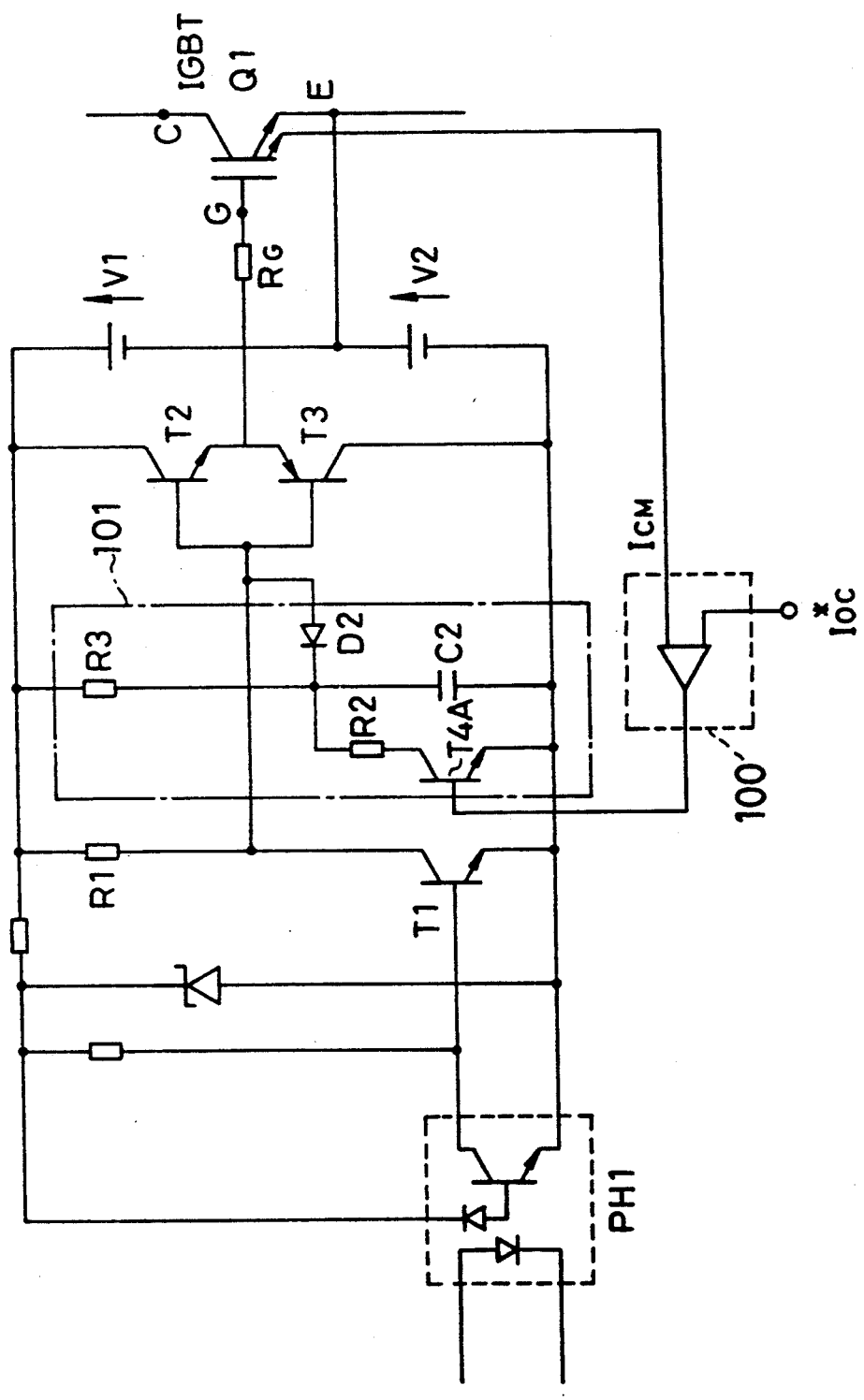
FIG. 7 is circuit diagram showing a gate drive circuit having a current limiting circuit.

FIG. 7 is a circuit diagram showing a gate drive circuit in accordance with a first embodiment of the present invention, which improves the conventional gate drive circuit of FIG. 5.

The normal operation of the gate drive circuit of FIG. 7 is similar to that of the circuit shown in FIG. 5; the IGBT is controlled by way of the photocoupler PH1, the transistor T1 connected to the photocoupler PH1, and the transistors T2 and T3 connected to the transistor T1.

The gate drive circuit of the first embodiment differs from the conventional circuit in that a current limiting circuit (a variable voltage source) 101 is connected to the bases of the transistors T2 and T3 of the output stage. The current limiting circuit 101 is composed of a diode D2, resistors R2 and R3, a capacitor C2 and a transistor T4A. The capacitor C2 is initially charged through the resistor R3 so that the voltage across the capacitor C2 becomes V1+V2. Since the diode D2 is connected between the positive terminal of the capacitor C2 and the base terminals of the transistors T2 and T3, the current limiting circuit has little effect on the normal operation of the gate drive circuit.

When the fault discrimination operational circuit 100 detects a fault, as discussed above in conjunction with the circuit of FIG. 5, the transistor T4A is turned on, and the electric charge initially stored on the capacitor C2 is discharged through the resistor R2. By selecting the values R1, R2 and R3 of the resistors as R1, R3>>R2, the difference between the voltage across the capacitor C2 and the off-gate voltage V2 is applied across the gate and emitter of the current sense IGBT Q1 via the diode D2 and the transistor T3. Consequently, the voltage across the gate and emitter of the IGBT Q1 gradually declines to zero and further to a negative voltage. Thus, the IGBT Q1 is gradually turned off, less abruptly than in the circuit of FIG. 5.

SECOND EMBODIMENT

Figure 8:
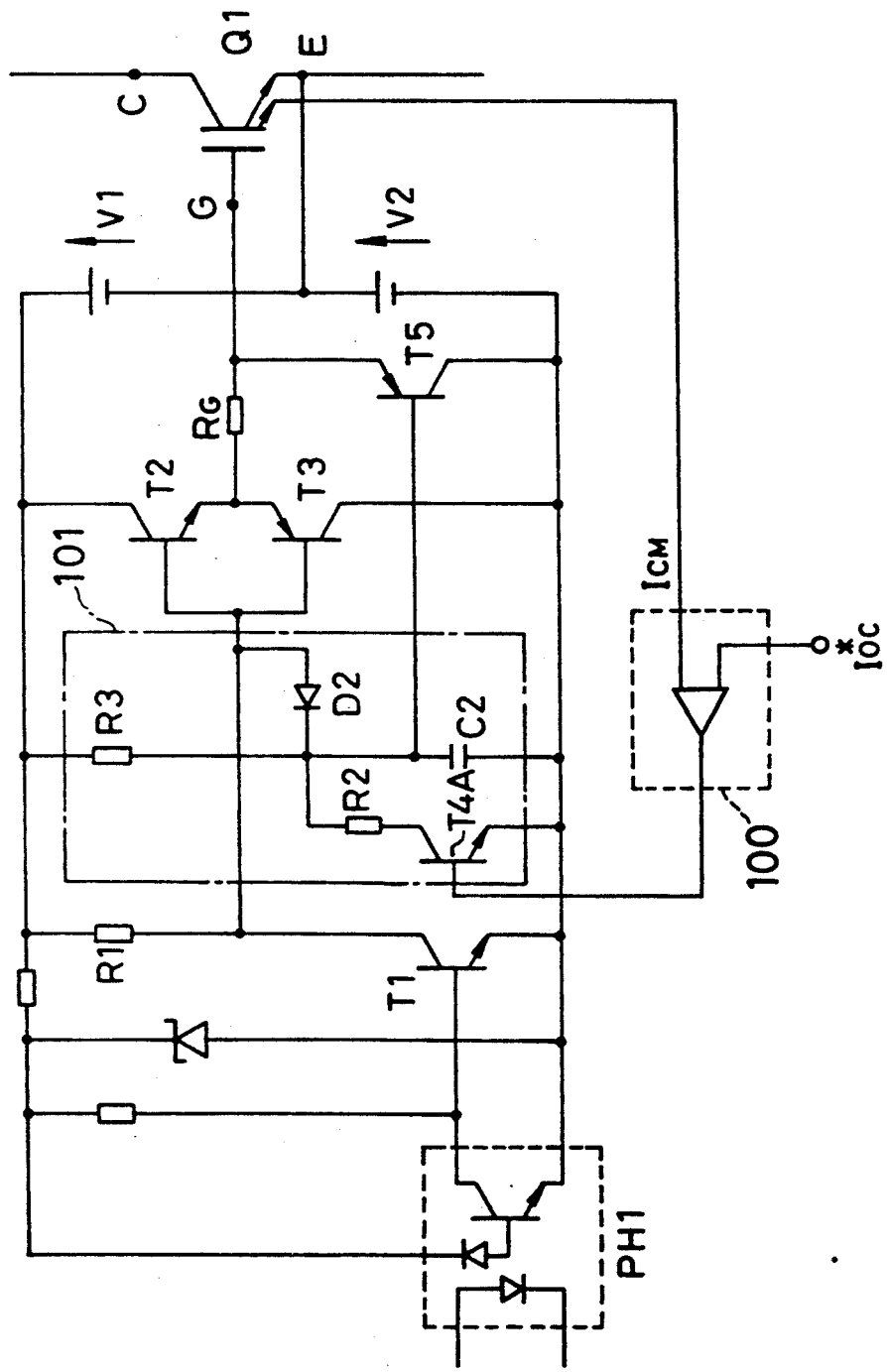
FIG. 8 is a circuit diagram showing a gate drive circuit having a current limiting circuit and transistor T5 connected to FIGS. 9A and 9B are diagrams illustrating the operation of the transistor T5, FIG. 9A showing an equivalent circuit of the IGBT Q1 and FIG. 9B illustrating a time transition waveform of the device voltage $V_{CE}$ of the IGBT during the short circuit fault.

FIG. 8 is a circuit diagram showing a gate drive circuit in accordance with a second embodiment of the present invention. The second embodiment differs from the first embodiment of FIG. 7 in that a PNP transistor T5 for conveying the current i ($=C_{CG} \cdot dV_{CE}/dt$) of the IGBT Q1 (see FIG. 9A) is connected to the gate of the IGBT Q1. More specifically, the emitter terminal of the transistor T5 is connected to the gate terminal G of the IGBT Q1, the base terminal of the transistor T5 is connected to the positive terminal of the capacitor C2, and the collector terminal of the transistor T5 is connected to the negative terminal of the off-gate voltage source V2.

When the IGBT Q1 increases its current owing to a short circuit fault in the on state, the transistor T4A is turned on via the fault discrimination operational circuit 100 as described with reference to FIG. 7, thereby discharging the capacitor C2. Accordingly, the transistor T5 gradually turns on.

Figure 9A:
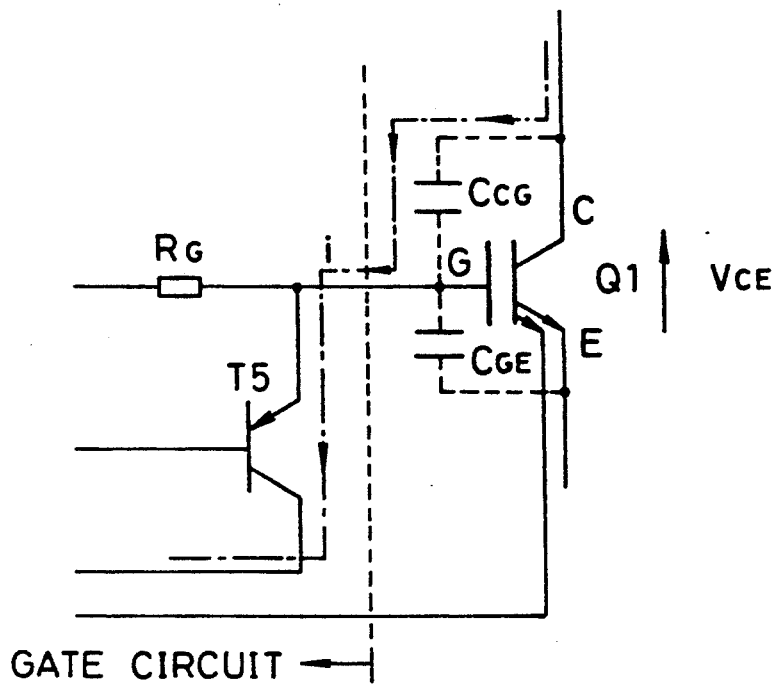
Figure 9B:
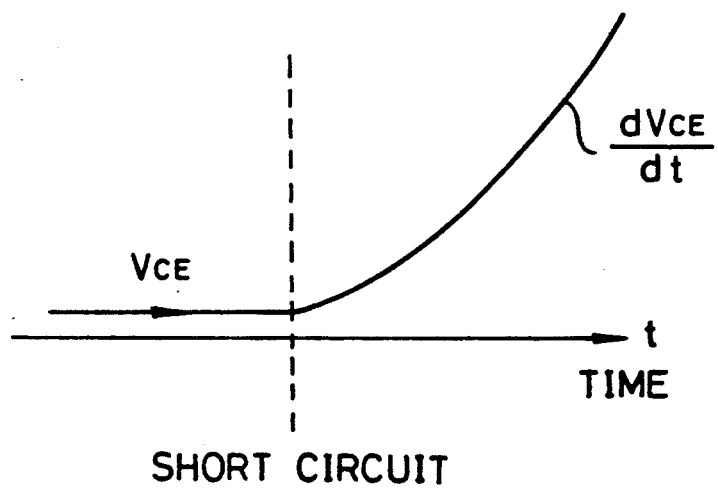

FIGS. 9A and 9B are diagrams illustrating the operation of the transistor T5, FIG. 9A shows an equivalent circuit of the IGBT Q1; and FIG. 9B illustrates a time transition waveform of the voltage $V_{CE}$ across the collector and emitter of the IGBT during the short circuit fault.

The IGBT Q1 has a junction capacitance $C_{CG}$ across the collector C and the gate G. Hence, when the voltage increasing ratio $dV_{CE}/dt$ is applied to the IGBT Q1, the current i ($=C_{CG} \cdot dV_{CE}/dt$) flows as illustrated FIG. 9A. In the circuit of FIG. 8, this current i flows through the transistor T5 so that the capacitance $C_{GE}$ across the gate and emitter of the IGBT Q1 is not charged by the current. As a result, the overcurrent protection operation of the IGBT Q1 is more positively carried out.

THIRD EMBODIMENT

Figure 10:
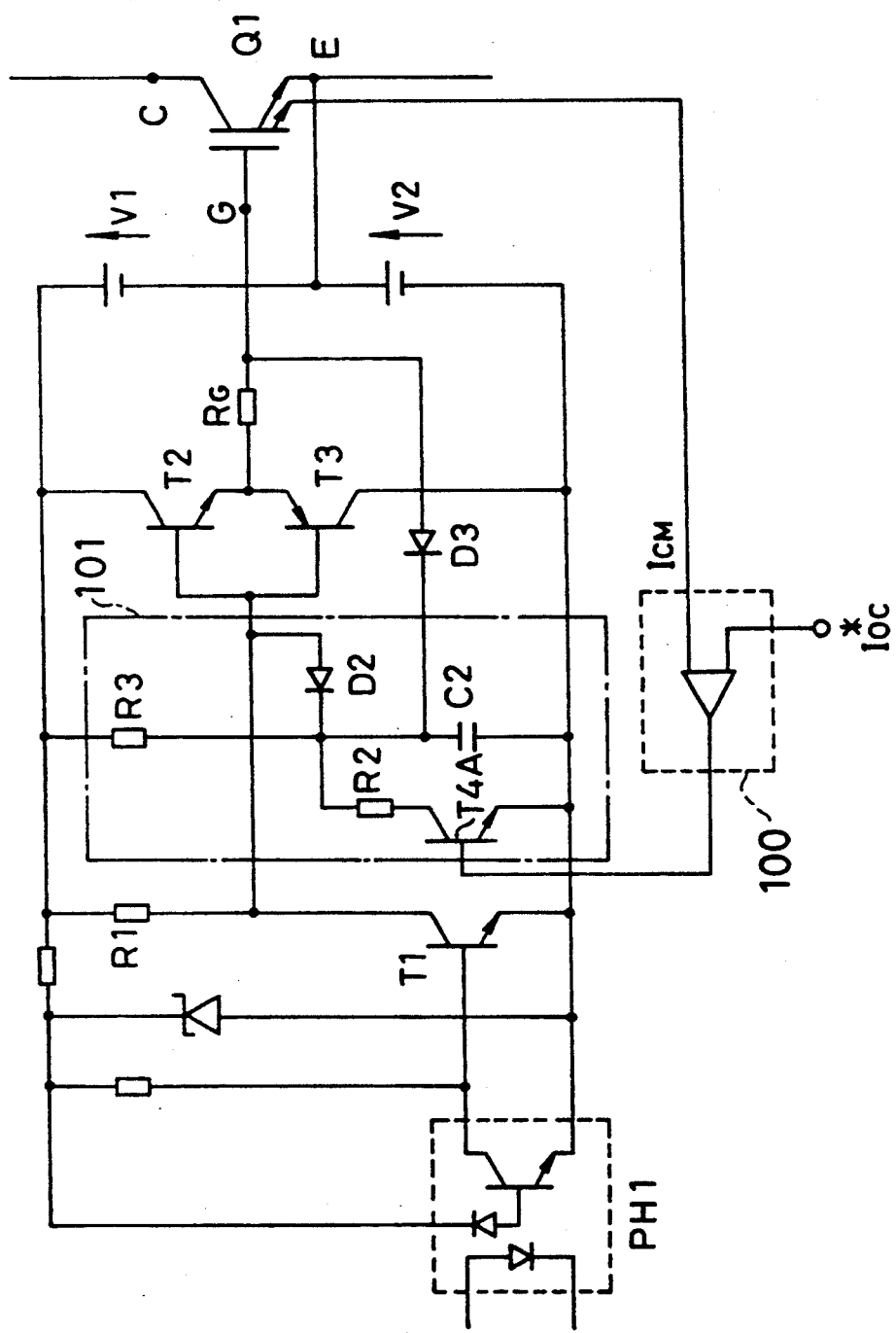
FIG. 10 is a circuit diagram of a gate drive circuit having a current limiting circuit and a diode D3 connected between the gate of IGBT Q1 and capacitor C2.

FIG. 10 is a circuit diagram of a gate drive circuit in accordance with a third embodiment of the present invention. The third embodiment differs from the first embodiment in that a diode D3 is connected between the gate terminal G of the IGBT Q1 and the positive terminal of the capacitor C2. The cathode of the diode D3 is connected to the positive terminal of the capacitor C2, and the anode of the diode is connected to the gate G. Thus, the current i of the IGBT Q1 described above with reference to FIG. 9 flows to the capacitor C2 via the diode D3.

Although specific embodiments of a drive circuit for a current sense IGBT constructed in accordance with the present invention have been disclosed, it is not intended that the invention be restricted to either the specific configurations or the uses disclosed herein. Modifications may be made in a manner obvious to those skilled in the art. Accordingly, it is intended that the invention be limited only by the scope of the appended claims.

What is claimed is:

1. A drive circuit for a current sense IGBT which has a main circuit through which a main current flows, a gate for controlling the main current flowing the main circuit, and a sense circuit which detects the main current and outputs a signal corresponding to the main current as a detected current, said drive circuit comprising:

means for discriminating an overcurrent of said main current on the basis of said detected current; and a variable voltage source means, connected between said means for discriminating and said gate of said IGBT, for gradually reducing a voltage applied to said gate of the IGBT while said means for discriminating detects the overcurrent.

2. A drive circuit for a current sense IGBT as claimed in claim 1, wherein said variable voltage source means comprises a capacitor having a terminal which is operatively connected to said gate of said current sense IGBT, and a discharge circuit, connected to said capacitor, for discharging said capacitor in response to an output of said means for discriminating.

3. A drive circuit for a current sense IGBT as claimed in claim 2, wherein said discharge circuit comprises a serial circuit of a resistor and a transistor, said serial circuit being connected to said capacitor in parallel fashion, a base of said transistor being connected to the output of said means for discriminating.

4. A drive circuit for a current sense IGBT as claimed in claim 3, wherein said means for discriminating comprises a comparator which compares the detected current outputted from said sense circuit of said IGBT with a predetermined reference signal.

5. A drive circuit for a current sense IGBT as claimed in claim 4, further comprising an on-gate voltage source for producing an on-gate voltage to be supplied to said gate of said IGBT, an off-gate voltage source for producing an off-gate voltage to be supplied to said gate of said IGBT, and switching circuit means for applying to said gate said on-gate voltage when turning on said IGBT and said off-gate voltage when turning off said IGBT.

6. A drive circuit for a current sense IGBT as claimed in claim 5, wherein an output of said variable voltage source is applied to an input of said switching circuit means so that the output of said variable voltage source means gradually reduces the on-gate voltage applied to said gate of said IGBT.

7. A drive circuit for a current sense IGBT which has a main circuit through which a main current flows, a gate for controlling the main current flowing the main circuit, and a sense circuit which detects the main current and outputs a signal corresponding to the main current as a detected current, said drive circuit comprising:
   means for discriminating an overcurrent of said main current on the basis of said detected current;
   a variable voltage source means, connected between said means for discriminating and said gate of said IGBT, for gradually reducing a voltage applied to said gate of the IGBT while said means for discriminating detects the overcurrent; and
   a transistor whose base terminal is connected to an output of said variable voltage source means, which transistor short circuits the gate and emitter of said IGBT in response to decline of the output of said variable voltage source means.

8. A drive circuit for a current sense IGBT as claimed in claim 7, wherein said variable voltage source means comprises a capacitor having a terminal which is operatively connected to said gate of said current sense IGBT, and a discharge circuit, connected to said capacitor, for discharging said capacitor in response to an output of said means for discriminating.

9. A drive circuit for a current sense IGBT as claimed in claim 8, wherein said discharge circuit comprises a serial circuit of a resistor and a transistor, said serial circuit being connected to said capacitor in parallel fashion, a base of said transistor being connected to the output of said means for discriminating.

10. A drive circuit for a current sense IGBT as claimed in claim 9, wherein said means for discriminating comprises a comparator which compares said detected current outputted from said sense circuit of said IGBT with a predetermined reference signal.

11. A drive circuit for a current sense IGBI as claimed in claim 10, further comprising an on-gate voltage source for producing an on-gate voltage to be supplied to said gate of said IGBT, an off-gate voltage source for producing an off-gate voltage to be supplied to said gate of said IGBT, and a switching circuit means for applying said on-gate voltage when turning on said IGBT and said off-gate voltage when turning off said IGBT.

12. A drive circuit for a current sense IGBT as claimed in claim 11, wherein an output of said variable voltage source means is applied to an input of said switching circuit so that the output of said variable voltage source means gradually reduces the on-gate voltage applied to said gate of said IGBT.

13. A drive circuit for a current sense IGBT which has a main circuit through which a main current flows, a gate for controlling the main current flowing the main circuit, and a sense circuit which detects the main current and outputs a signal corresponding to the main current as a detected current, said drive circuit comprising:
   means for discriminating an overcurrent of said main current on the basis of said detected current;
   a variable voltage source means, connected between said means for discriminating and said gate of said IGBT, for gradually reducing a voltage applied to said gate of the IGBT while said means for discriminating detects the overcurrent; and
   a diode connected between the gate of said IGBT and an output of said variable voltage source means for guiding a current $i = C_{CG} \cdot dV_{CE}/dt$ of said IGBT to said variable voltage source $C_{CG} \cdot dV_{CE}/dt$ of said IGBT to said variable voltage source $C_{CG}$ is a junction capacitance between the collector and gate of said IGBT, and $V_{CE}$ is a collector-to-emitter voltage of said IGBT.

14. A drive circuit for a current sense IGBT as claimed in claim 13, wherein said variable voltage source means comprises a capacitor having a terminal is operatively connected to said gate of said current sense IGBT, and a discharge circuit, connected to said capacitor, for discharging said capacitor in response to an output of said means for discriminating.

15. A drive circuit for a current sense IGBT as claimed in claim 14, wherein said discharge circuit comprises a serial circuit of a resistor and a transistor, said serial circuit being connected to said capacitor in parallel fashion, a base of said transistor being connected to the output of said means for discriminating.

16. A drive circuit for a current sense IGBT as claimed in claim 15, wherein said means for discriminating comprises a comparator which compares said detected current outputted from said sense circuit of said IGBT with a predetermined reference signal.

17. A drive circuit for a current sense IGBT as claimed in claim 16, further comprising an on-gate voltage source for producing an on-gate voltage to be supplied to said gate of said IGBT, an off-gate voltage source for producing an off-gate voltage to be supplied to said gate of said IGBT, and a switching circuit means for applying said on-gate voltage when turning on said IGBT and said off-gate voltage when turning off said IGBT.

18. A drive circuit for a current sense IGBT as claimed in claim 17, wherein an output of said variable voltage source means is applied to an input of said switching circuit means so that the output of said variable voltage source means gradually reduces the on-gate voltage applied to said gate of said IGBT.

19. A drive circuit for controlling a current sense IGBT in response to a drive signal, the current sense IGBT having a collector terminal, an emitter terminal, a gate terminal, and a current detecting terminal, said drive circuit comprising:
   a first transistor having a base terminal and first and second main terminals;
   a second transistor having a base terminal and first and second main terminals, the base terminal of the second transistor being connected to the base terminal of the first transistor and the second main terminal of the second transistor being connected to the second main terminal of the first transistor;
   means for electrically connecting the second main terminals of the first and second transistors to the gate terminal of the current sense IGBT;

an on-gate voltage source connected between the emitter terminal of the current sense IGBT and the first main terminal of the first transistor;

an off-gate voltage source connected between the emitter terminal of the current sense IGBT and the first main terminal of the second output transistor;

input means, connected to the base terminals of the first and second transistors, for receiving the drive signal and for generating an input signal for the first and second transistors in response to the drive signal, the input signal having a first digital state or a second digital state; and current limiting means for protecting the current sense IGBT if an overcurrent flows through it, the current limiting means including a resistor and a capacitor connected in series between the first main terminal of the first transistor and the first main terminal of the second transistor, the resistor and the capacitor being connected to one another at an intermediate connection point, a diode connecting the intermediate connection point to the base terminals of the first and second transistors, another resistor, a third transistor having a base terminal and having a main current path, the another resistor and the main current path of the third resistor being connected in series across the capacitor, and means, connected to the current detecting terminal of the current sense IGBT, for supplying a signal to the base terminal of the third transistor if an overcurrent occurs.

20. The drive circuit of claim 19, further comprising a fourth transistor having a base terminal and first and second main terminals, the first main terminal of the fourth transistor being connected to the gate terminal of the current sense IGBT, the second main terminal of the fourth transistor being connected to the first main terminal of the second transistor, and the base terminal of the fourth transistor being connected to the intermediate connection point.

21. The drive circuit of claim 19, further comprising a diode connecting the gate terminal of the current sense IGBT to the intermediate connection point.

* * * * *